US012236317B2

(12) United States Patent
Carroll et al.

(10) Patent No.: US 12,236,317 B2
(45) Date of Patent: Feb. 25, 2025

(54) ENERGY RELAXATION SPECTROSCOPY USING AUTLER-TOWNES EFFECT

(71) Applicant: International Business Machines Corporation, Armonk, NY (US)

(72) Inventors: Malcolm Scott Carroll, Cranbury, NJ (US); Sami Rosenblatt, White Plains, NY (US); Abhinav Kandala, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 515 days.

(21) Appl. No.: 17/694,051

(22) Filed: Mar. 14, 2022

(65) Prior Publication Data

US 2023/0289642 A1 Sep. 14, 2023

(51) Int. Cl.
*G06N 10/40* (2022.01)
*G06F 30/20* (2020.01)
(Continued)

(52) U.S. Cl.
CPC ............ *G06N 10/40* (2022.01); *G06N 10/80* (2022.01); *G06F 30/20* (2020.01); *G06F 30/3308* (2020.01); *G06N 10/60* (2022.01)

(58) Field of Classification Search
CPC ........ G06N 10/40; G06N 10/60; G06N 10/80; G06F 30/20; G06F 30/3308
(Continued)

(56) References Cited

U.S. PATENT DOCUMENTS 7,847,615 B2    12/2010   Yorozu et al.
9,432,024 B2    8/2016    Chow et al.
(Continued)

FOREIGN PATENT DOCUMENTS

CN    112215360 A    1/2021
CN    112444714 A    3/2021
(Continued)

OTHER PUBLICATIONS

Carroll et al., Dynamics of Superconducting Qubit Relaxation Times, https://arxiv.org/abs/2105.15201, dated May 31, 2021.
(Continued)

*Primary Examiner* — Phallaka Kik
(74) *Attorney, Agent, or Firm* — Amin, Turocy & Watson, LLP

(57) ABSTRACT

One or more systems, devices, computer program products and/or computer-implemented methods of use provided herein relate to analysis of qubit coherence parameters of a physical qubit layout of a quantum computer. A system can comprise a pulse component for transmitting signals to a qubit, a readout component for receiving signals form the qubit, a memory that stores computer executable component, and a processor that executes the computer executable components stored in the memory. The computer executable components are executable to cause the pulse component to generate a first pulse to drive the qubit, cause the pulse component to generate a second pulse comprising an Autler-Townes off-resonant tone, and determine a probability relative to the qubit, in view of a shift of the qubit to a shifted frequency caused by the second pulse.

20 Claims, 10 Drawing Sheets

(51) Int. Cl.
*G06F 30/3308* (2020.01)
*G06N 10/60* (2022.01)
*G06N 10/80* (2022.01)

(58) Field of Classification Search
USPC .............................. 716/100, 111, 106, 136
See application file for complete search history.

(56) References Cited

U.S. PATENT DOCUMENTS

| | | | |
|---|---|---|---|
| 10,467,544 B2 | 11/2019 | Filipp et al. | |
| 10,622,536 B2 | 4/2020 | Chow et al. | |
| 10,755,193 B2 | 8/2020 | Kandala et al. | |
| 10,833,680 B2 | 11/2020 | Mckay et al. | |
| 10,892,398 B2 | 1/2021 | Pollanen et al. | |
| 10,924,095 B1 | 2/2021 | Mckay et al. | |
| 11,004,009 B2 | 5/2021 | Monroe et al. | |
| 11,017,310 B2 | 5/2021 | Chu et al. | |
| 11,681,016 B1* | 6/2023 | Bohaichuk | G01S 7/021 342/195 |
| 2019/0165244 A1 | 5/2019 | Hertzenberg et al. | |
| 2020/0274703 A1* | 8/2020 | Lukens | G06N 10/00 |
| 2021/0036206 A1 | 2/2021 | Neill et al. | |
| 2021/0182096 A1 | 6/2021 | Walker et al. | |
| 2021/0272001 A1* | 9/2021 | Smelyanskiy | G06N 10/20 |
| 2022/0196716 A1* | 6/2022 | Anderson | G01R 29/10 |
| 2023/0169252 A1* | 6/2023 | Stehlik | G06F 30/392 716/119 |
| 2023/0176935 A1* | 6/2023 | Earnest-Noble | G06F 11/004 714/47.2 |
| 2023/0289400 A1* | 9/2023 | Carroll | G06N 10/40 |

FOREIGN PATENT DOCUMENTS

| | | |
|---|---|---|
| WO | 2018063168 A1 | 4/2018 |
| WO | 2020263255 A | 12/2020 |
| WO | 2021/170164 A1 | 9/2021 |

OTHER PUBLICATIONS

Magnard et al., Fast and Unconditional All-Microwave Reset of a Superconducting Qubit, https://arxiv.org/abs/1801.07689, dated Jan. 23, 2018.

Egger et al., Pulsed Reset Protocol for Fixed-Frequency Superconducting Qubits, https://doi.org/10.1103/PhysRevApplied.10.044030, dated Apr. 1, 2019.

Lisenfeld et al., Electric Field Spectroscopy of Material Defects in Transmon Qubits, npj Quantum Information, 5:105, 2019.

Burnett et al., Decoherence Benchmarking of Superconducting Qubits, npj Quantum Information, 5:54, 2019.

Klimov et al., Fluctuations of Energy-Relaxation Times in Superconducting Qubits, https://doi.org/10.48550/arXiv.1809.01043, access Mar. 2, 2022.

Abdurakhimov et al., Driven-State Relaxation of a Coupled Qubit-Defect System in Spin-Locking Measurements, Phys. Rev. B 102, 100502(R), 2020.

Jurcevic et al., Demonstration of Quantum vol. 64 on a Superconducting Quantum Computing System, https://arxiv.org/abs/2008.08571, dated Sep. 4, 2020.

McRae et al., Reproducible Coherence Characterization of Superconducting Quantum Devices, Appl. Phys. Lett. 119, 100501, 2021.

Li, G. et al., Towards Efficient Superconducting Quantum Processor Architecture Design, ASPLOS'20, Mar. 16-20, 2020, Lausanne, Switzerland.

IBM, IBM ILOG CPLEX Optimizer, Webpage https://www.ibm.com/analytics/cplex-optimizer, last accessed Nov. 24, 2021.

Hertzberg, et al., Laser-annealing Josephson junctions for yielding scaled-up superconducting quantum processors, arXiv:2009.00781v4, dated Sep. 23, 2020.

Zhang, et al., High-fidelity superconducting quantum processors via laser-annealing of transmon qubits, arXiv:2012.08475v1, dated Dec. 15, 2020.

Morvan, et al., Optimizing frequency allocation for fixed-frequency superconducting quantum processors, arXiv:2112.01634v1, dated Dec. 2, 2021.

Mell et al., The NIST Definition of Cloud Computing, Recommendations of the National Institute of Standards and Technology, NIST Special Publication 800-145, 2011.

List of IBM Patents and Patent Applications Treated as Related.

International Search Report and Written Opinion received for PCT Application Serial No. PCT/E P2022/086455 dated Mar. 14, 2023, 15 pages.

Wei K X et al: "Quantum crosstalk cancellation for fast entangling gates and improved multi-qubit performance", arxiv.org, Cornell University Library, 201 Olin Library Cornell University Ithaca, NY 14853, Jun. 1, 2021.

* cited by examiner

ENERGY RELAXATION SPECTROSCOPY USING AUTLER-TOWNES EFFECT

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

On a large scale, quantum computing cloud service providers can execute millions of quantum jobs for users during a year. Each quantum job can include the execution of one or more quantum programs at a physical logic circuit. Physical, real-world, quantum logic circuits controlled by a quantum system can include a plurality of qubits.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate a process to analyze coherence parameters of physical qubits of a real-world physical qubit layout of a quantum computer.

In accordance with an embodiment, a system can comprise a pulse component for transmitting signals to a qubit, a readout component for receiving signals form the qubit, a memory that stores computer executable component, and a processor that executes the computer executable components stored in the memory. The computer executable components are executable to cause the pulse component to generate a first pulse to drive the qubit, cause the pulse component to generate a second pulse comprising an Autler-Townes off-resonant tone, and determine a probability relative to the qubit, in view of a shift of the qubit to a shifted frequency caused by the second pulse.

In accordance with another embodiment, a computer-implemented method can comprise emitting, by a system operatively coupled to a processor, one or more first pulses driving a qubit. The method can comprise emitting, by the system, a second pulse comprising an Autler-Townes off-resonant tone and shifting the frequency of the qubit. The method can further comprise determining, by the system, a probability relative to the qubit in view of the shift of the qubit to a shifted frequency caused by the second pulse.

In accordance with yet another embodiment, a computer program product facilitating a process to analyze qubit coherence parameters can comprise a computer readable storage medium having program instructions embodied therewith, the program instructions executable by a processor to cause the processor to cause emission, by the processor, of one or more first pulses driving a qubit. The program instructions can be executable by the processor to cause the processor to cause emission, by the processor, of a second pulse comprising an Autler-Townes off-resonant tone and shifting the frequency of the qubit. Additionally, the program instructions can be executable by the processor to cause the processor to determine, by the processor, a probability relative to the qubit in view of the shift of the qubit to a shifted frequency caused by the second pulse.

An advantage of the aforementioned system, computer-implemented method and/or computer program product can be an increase in understanding of qubit coherence parameters and/or of fluctuations in the qubit coherence parameters. Further advantages can comprise an ability to rapidly plot energy relaxation of qubits and/or to collect information facilitating understanding of two-level systems (TLSs) of a particular quantum processor or quantum logic circuit.

DETAILED DESCRIPTION

Figure 1:
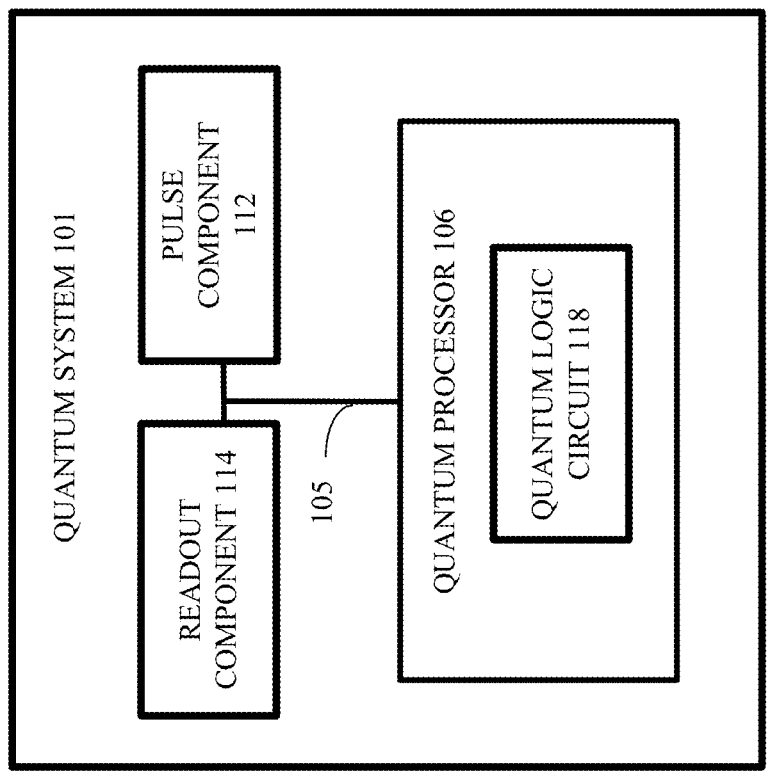
FIG. 1 illustrates a block diagram of an example, non-limiting system that can facilitate a process to analyze qubit coherence parameters, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As used herein, a quantum circuit can be a set of operations, such as gates, performed on a set of real-world physical qubits with the purpose of obtaining one or more qubit measurements. A quantum processor can comprise the one or more real-world physical qubits.

Qubit states only can exist (or can only be coherent) for a limited amount of time. Thus, an objective of operation of a quantum logic circuit (e.g., including one or more qubits) can be to maximize the coherence time of the employed qubits. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in one or more cases.

Operation of the quantum circuit can be facilitated, such as by a waveform generator, to produce one or more physical pulses and/or other waveforms, signals and/or frequencies to alter one or more states of one or more of the physical qubits. The altered states can be measured, thus allowing for one or more computations to be performed regarding the qubits and/or the respective altered states.

Operations on qubits generally can introduce some error, such as some level of decoherence and/or some level of quantum noise, further affecting qubit availability. Quantum noise can refer to noise attributable to the discrete and/or probabilistic natures of quantum interactions.

A two-level system, among other noise causes, can comprise a source of noise that can cause deterioration of coherence parameters of one or more qubits of a quantum logic circuit. The noise can couple to a low-energy thermal fluctuator, for example, and can randomly change energy of the noise in the vicinity of a qubit frequency. The qubit frequency is the resonance frequency of a qubit energy transition between two states such as, but not limited to, the ground and first excited states of the qubit. The vicinity of a qubit frequency is a frequency range which in some embodiments can range from about 10 megahertz (MHz) below the qubit frequency to about 10 MHz above the qubit frequency. In other embodiments, the vicinity of a qubit frequency can range from about 100 MHz below the qubit frequency to about 100 MHz above the qubit frequency. In still other embodiments, the vicinity of a qubit frequency can range from about 1 gigahertz (GHz) below the qubit frequency to about 1 GHz above the qubit frequency. Without being limited to theory, it is believed that such two-level systems can be caused by atomic scale defects in surface oxides on the metals and/or on the silicon of a physical real-world qubit and can be electromagnetically active. Indeed, a qubit, such as a transmon itself is a resonator with an electromagnetic excitation, and thus a qubit excitation can couple with a two-level system (TLS) and can cause performance issues for a quantum logic circuit, such as, but not limited to, deterioration of qubit parameters.

Due to presence of so-called two-level systems in/at the quantum system and/or due to maintenance and/or diagnostics to be performed relative to coherence times of a particular qubit, one or more qubits, such as superconducting qubits, can be unavailable and/or not recommended for use with the quantum logic circuit, even if desired for use. Furthermore, absent understanding of such two-level systems and their associated fluctuations relative to the frequency domain of one or more qubits of a quantum system, coherence of the qubit can be affected. Loss of coherence can cause failure of execution of a quantum circuit, thus wasting power, time, queue space and/or memory relative to a queue of jobs to be performed on a respective quantum system.

There can be varying causes for loss of qubit coherence. Some causes of decoherence can be equipment related. When coherence of a qubit suddenly changes, or changes gradually over time, one or more existing solutions can comprise not employing the qubit until the coherence deterioration is reduced or ends altogether, such as compared to historical coherence parameters for the particular qubit. Absent understanding, such as definitive understanding, that the change in qubit coherence parameters is caused by a two-level system, unnecessary diagnostics and/or maintenance can be performed, such as switching out cables, swapping control electronics, warming up a super-cooled refrigeration system of the quantum system to troubleshoot components, and/or the like. Also, even when a TLS is suspected as a culprit of noise issues, existing techniques for analyzing the frequency space about a qubit's unperturbed frequency, can be cumbersome, timely, resource intensive, and/or manually intensive relative to at least the scheduling and operation of associated diagnostics. The unperturbed frequency of the qubit is the resonance frequency of the qubit as fabricated, in the absence of external effects that may shift its frequency, including but not limited to magnetic flux bias, DC electric field, mechanical strain, and/or an Autler-Townes (AT) effect (also known as an AC Stark effect).

In view of unintended or unforeseen decoherence, waste of quantum resources, time, power, and/or labor can occur. Indeed, because quantum processors and quantum systems are scarce and costly resources, such waste can be detrimental to both users and administrators of quantum systems. Put another way, each quantum processor can have a fixed number of qubits it supports. When quantum circuits cannot use the full capacity of a quantum processor, one or more qubits can remain idle. Thus, it can be desired to facilitate a process for understanding deteriorations and/or changes in qubit coherence parameters to in turn provide more informed queuing of quantum jobs and/or mapping of quantum circuits of the quantum jobs.

Moreover, different quantum circuits can require varying resources. For example, one quantum circuit can use different physical qubits of a quantum logic circuit of a respective quantum system than another quantum circuit. During scheduling of quantum jobs from a queue and corresponding mapping of quantum circuits to a quantum logic circuit, particular qubits can be desirable for use with one quantum circuit as compared to other qubits of a same quantum logic circuit. Quantum noise, such as two-level systems can therefore interfere, often unknowingly, with this mapping. Therefore, device designs that can target qubits having a longer lifetime of their respective quantum states and/or having longer coherence time can be desirable.

To address the aforementioned presence of two-level systems, lack of information regarding qubit coherence parameters, and/or diagnostics/maintenance to address noise, described herein are one or more embodiments of a system, computer-implemented method and/or computer program product that can analyze the frequency space of a qubit, to allow for better understanding and/or prediction of evolving coherence parameters of the qubit. Indeed, the one or more embodiments described herein can account for one or more deficiencies of existing techniques for analyzing qubit coherence parameters of one or more qubits, including both fixed frequency qubits and multi-junction qubits.

With respect to single junction qubits, such as single Josephson junction transmons with fixed frequency couplings, such type of qubit represents a device architecture that can be employed in a device having even 60 or more qubits, for example. The single junction configuration can offer advantages such as reduced sensitivity to flux noise, while preserving the transmon charge insensitivity and reducing system complexity with few control inputs (e.g., due to the single junctions). However, due to the limited frequency tunability of single junction qubits, existing TLS spectroscopy techniques are limited, cumbersome and/or time-consuming.

Generally, provided are one or more embodiments of a system, computer-implemented method and/or computer program product that can facilitate an all-microwave process to employ an excited qubit shifted in frequency as a probe of the energy relaxation rate at frequencies at or around the qubit's frequency. Understanding this neighborhood (i.e., vicinity) can allow for one or more determinations to be made regarding coherence parameters of the qubit at different shifted frequencies. These coherence parameters can be dynamic, fluctuate and/or otherwise change when in the presence of or coming into at least partial resonance with a TLS.

By employing the one or more embodiments described herein, the understanding can further facilitate informed use of the qubit, informed diagnostics of the qubit, and moreover, informed diagnostics/maintenance/calibration/setup of the quantum processor comprising the qubit. This can include optimization of mapping of a quantum circuit, queuing of quantum jobs, and/or general use of a particular qubit of a quantum processor. Indeed, such understanding can be gained, such as separately on a qubit-by-qubit basis, to gain an understanding regarding frequency space about a group of qubits of a quantum processor or other quantum device.

An existing technique to measure energy relaxation rate, decoherence, is to measure a probability $P_1$ that a qubit is still found in the |1> state after being initialized in the |1> state. Many different wait times are typically used to reconstruct a decay of the value of $P_1$. The resulting decay curves are often fit to an exponential decay function with a characteristic decoherence time, $T_1$. Decays from higher excited states can also be used to deduce $T_1$ for other states with probabilities $P_2$, $P_3$, ..., $P_n$, where |n> is a state of the qubit. Additionally, since a decay typically results in an increase in the population of the ground state, |0>, the corresponding increase in the probability of the qubit being found in the |0> state can also be measured to deduce a corresponding $T_1$. Typical wait times for reconstructing a decay range, but are not limited to, from about 0 microseconds to about 100 microseconds in some embodiments, from about 0 microseconds to about 500 microseconds in some other embodiments, and from about 0 microseconds to about 2000 microseconds in yet some other embodiments.

Instead, the decoherence information can be gained more quickly by determining a probability ($P_1$) of a qubit measurement resulting in the respective |1> state, or another state. This probability $P_1$ can be used as a proxy for time-to-decoherence ($T_1$) of the particular qubit, combined with knowing the delay time, tau, when $P_1$ was measured after the |1> state was initialized, and assuming an exponential decay function. The $T_1$ is the characteristic 1/e (about 0.37 of initial value of $P_1$) decay time of the exponential fit function.

When the qubit is affected by an Autler-Townes (AT) effect, also known as the AC Stark effect, a $T_1$ may be measured at a perturbed frequency away from the unperturbed qubit frequency. The $T_1$ is the 1/e fit to either a sequence of $P_1$s measured at different delay times, tau, or a single $P_1$ measured at a fixed delay time tau can alternatively be used as an alternative fast estimator. Put another way, off-resonant microwave tones (i.e., waves with a set of amplitude, frequency, and spectral purity) can be employed to drive AT shifts (i.e., shifts of the unperturbed qubit frequency to a new qubit frequency due to the application of an AT tone) of the fundamental qubit transition (i.e., qubit energy transition between its ground and first excited states) and can spectrally resolve qubit energy relaxation times. Dips in energy relaxation times can serve as a probe of a frequency location of a probable TLS, such as a strongly coupled TLS. Thus, by adjusting power/amplitude and/or AT tone during the process, full $T_1$ decay for the qubit can be estimated more quickly than directly testing and measuring the full, actual $T_1$ decay for the qubit at each desired frequency.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

Figure 2:
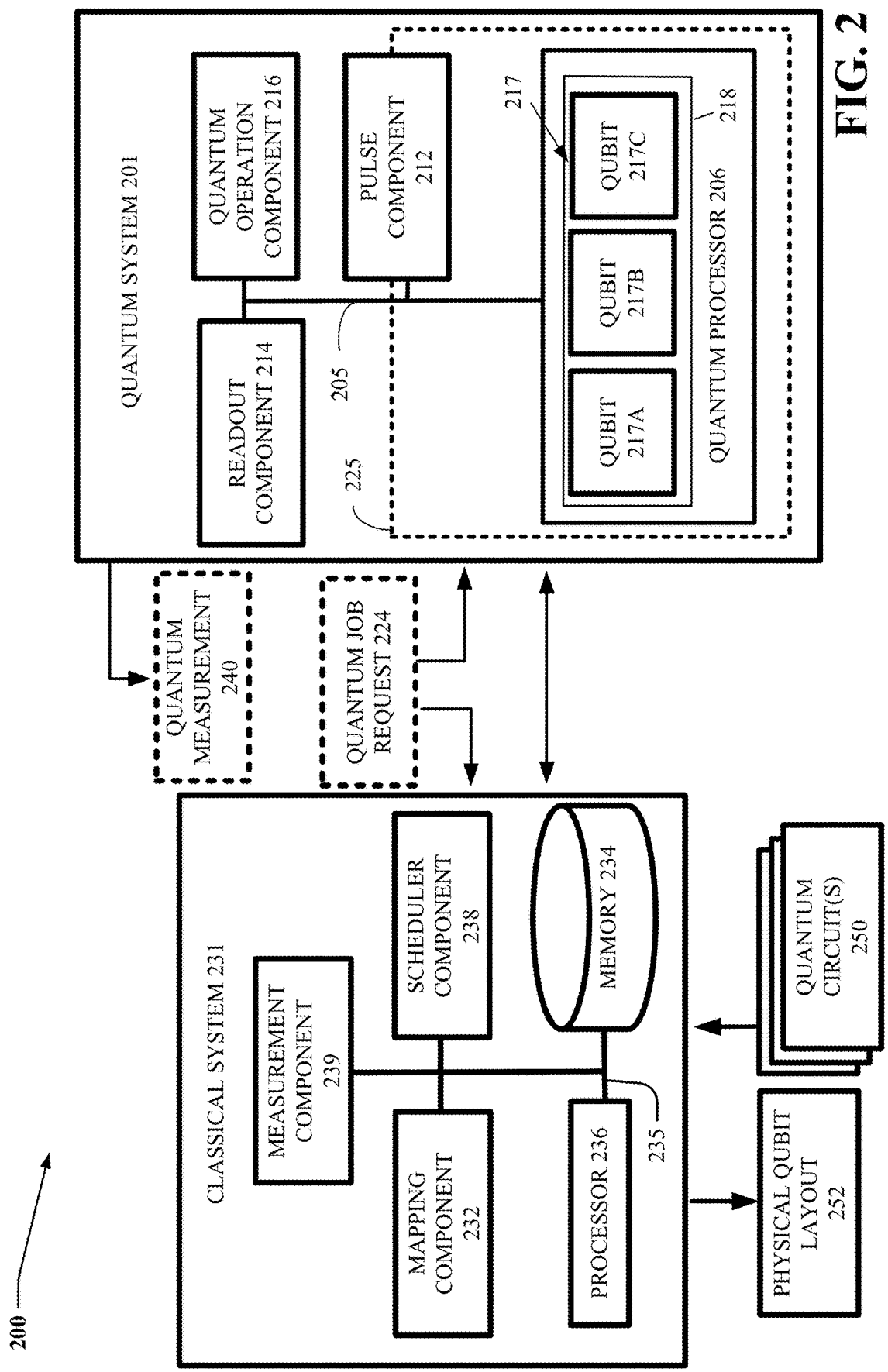
FIG. 2 illustrates a block diagram of another example, non-limiting system that can facilitate a process to analyze qubit coherence parameters, in accordance with one or more embodiments described herein.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting systems 100 and/or 200 as illustrated at FIGS. 1 and 2, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIGS. 1 and/or 2 and/or with other figures described herein.

Turning first generally to FIG. 1, one or more embodiments described herein can include one or more devices, systems and/or apparatuses that can facilitate TLS and qubit excitation spectroscopy, as briefly described above. For example, FIG. 1 illustrates a block diagram of an example, non-limiting system 100 that can employ a pulse component to probe frequency space of a qubit of a quantum logic circuit of a quantum system.

At FIG. 1, illustrated is a block diagram of an example, non-limiting system 100 that can facilitate such probing process, in accordance with one or more embodiments described herein. While referring here to one or more processes, facilitations and/or uses of the non-limiting system 100, description provided herein, both above and below, also can be relevant to one or more other non-limiting systems described herein, such as the non-limiting system 200, to be described below in detail.

As illustrated at FIG. 1, the non-limiting system 100 can comprise a quantum system 101. The quantum system 101 can comprise one or more components, such as quantum processor 106, bus 105, pulse component 112 and/or readout component 114. It is noted that while the readout component 114 is shown as being comprised by the quantum system 101, in one or more other embodiments, the readout component 144 can be at least partially external to the quantum system 101. The quantum processor 106 can comprise one or more physical qubits in a quantum logic circuit 118.

Generally, the pulse component 112 can generate one or more pulses to excite a qubit and/or shift a qubit to a frequency different than its respective unperturbed qubit frequency. The pulse component 112 can emit an Autler-Townes off-resonant tone (AT tone) as one of various different pulses. Such AT tones can facilitate shifting of a qubit to a different frequency. The tone is "off-resonant" because it is not at the resonant qubit frequency of the qubit (the unperturbed qubit frequency) or any other resonance between |n> and |n+m>, where n and m are non-negative integers. Generally, the readout component 114, in response to emission of another pulse by the pulse component 112, and by applying one or more equations, can facilitate determination of one or more characteristics of the affected qubit, such as in combination with a classical system (not shown). These characteristics can include and/or be related to frequency, excited state, probability of finding the affected qubit in a particular qubit state, and/or coherence/deterioration times of the qubit. These characteristics can be determined absent external effects that can shift the qubit's frequency, including but not limited to DC electric field and/or mechanical strain. These characteristics can also be determined absent a magnetic flux bias, and thus the qubits analyzed and/or affected can be single junction qubits and/or fixed frequency qubits.

Turning next to FIG. 2, the figure illustrates a diagram of an example, non-limiting system 200 that can facilitate TLS and qubit excitation spectroscopy and subsequent analysis of the results. For example, FIG. 2 illustrates a block diagram of an example, non-limiting system 200 that can employ a pulse component to affect a qubit 217, and a measurement readout component 214 that can be employed to measure one or more characteristics of the affected qubit 217. Repetitive description of like elements and/or processes employed in respective embodiments is omitted for sake of brevity. As indicated previously, description relative to an embodiment of FIG. 1 can be applicable to an embodiment of FIG. 2. Likewise, description relative to an embodiment of FIG. 2 can be applicable to an embodiment of FIG. 1.

In one or more embodiments, the non-limiting system 200 can be a hybrid system and thus can include both a quantum system and a classical system, such as a quantum system 201 and a classical-based system 231 (also herein referred to as a classical system 231). In one or more other embodiments, the quantum system 201 can be separate from, but function in combination with, the classical system 231. In one or more embodiments, one or more components of the quantum system 201, such as the readout component 214, can be at least partially comprised by the classical system 231, or otherwise comprised external to the quantum system 201.

One or more communications between one or more components of the non-limiting system 200 can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

The classical system 231 and/or the quantum system 201 can be associated with, such as accessible via, a cloud computing environment described below with reference to FIG. 9 and/or with one or more functional abstraction layers described below with reference to FIG. 10 (e.g., hardware and software layer 1060, virtualization layer 1070, management layer 1080 and/or workloads layer 1090). For example, the classical system 231 can be associated with a cloud computing environment 950 such that aspects of classical processing can be distributed between the classical system 231 and the cloud computing environment 950.

Generally, the classical system 231 can comprise any suitable type of component, machine, device, facility, apparatus and/or instrument that comprises a processor and/or can be capable of effective and/or operative communication with a wired and/or wireless network. All such embodiments are envisioned. For example, the classical system 231 can comprise a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device. Likewise, the classical system 231 can be disposed and/or run at any suitable device, such as, but not limited to a server device, computing device, general-purpose computer, special-purpose computer, quantum computing device (e.g., a quantum computer), tablet computing device, handheld device, server class computing machine and/or database, laptop computer, notebook computer, desktop computer, cell phone, smart phone, consumer appliance and/or instrumentation, industrial and/or commercial device, digital assistant, multimedia Internet enabled phone, multimedia players and/or another type of device and/or computing device.

The classical system 231 can comprise a plurality of components. The components can include a memory 234, processor 236, bus 235, mapping component 232, measurement component 239 and/or scheduler component 238. Generally, the classical system 231 can facilitate receipt of a quantum job request 224 and/or receipt of one or more quantum circuits 250 to be operated on the quantum system 201 relative to the quantum logic circuit 218 of the quantum system 201.

Discussion now turns briefly to the processor 236, memory 234 and bus 235 of the classical system 231. For example, in one or more embodiments, the classical system 231 can comprise the processor 236 (e.g., computer processing unit, microprocessor, classical processor, quantum processor and/or like processor). In one or more embodiments, a component associated with classical system 231, as described herein with or without reference to the one or more figures of the one or more embodiments, can comprise one or more computer and/or machine readable, writable and/or executable components and/or instructions that can be executed by processor 236 to facilitate performance of one or more processes defined by such component(s) and/or instruction(s). In one or more embodiments, the processor 236 can comprise the mapping component 232, measurement component 239 and/or the scheduler component 238.

In one or more embodiments, the classical system 231 can comprise the computer-readable memory 234 that can be operably connected to the processor 236. The memory 234 can store computer-executable instructions that, upon execution by the processor 236, can cause the processor 236 and/or one or more other components of the classical system 231 (e.g., mapping component 232, measurement component 239 and/or scheduler component 238) to perform one or more actions. In one or more embodiments, the memory 234 can store computer-executable components (e.g., mapping component 232, measurement component 239 and/or scheduler component 238).

The classical system 231 and/or a component thereof as described herein, can be communicatively, electrically, operatively, optically and/or otherwise coupled to one another via a bus 235. Bus 235 can comprise one or more of a memory bus, memory controller, peripheral bus, external bus, local bus, quantum bus and/or another type of bus that can employ one or more bus architectures. One or more of these examples of bus 305 can be employed to implement one or more embodiments described herein.

In one or more embodiments, the classical system 231 can be coupled (e.g., communicatively, electrically, operatively, optically and/or like function) to one or more external systems (e.g., a non-illustrated electrical output production system, one or more output targets, an output target controller and/or the like), sources and/or devices (e.g., classical and/or quantum computing devices, communication devices and/or like devices), such as via a network. In one or more embodiments, one or more of the components of the classical system 231 and/or of the non-limiting system 200 can reside in the cloud, and/or can reside locally in a local computing environment (e.g., at a specified location(s)).

In addition to the processor 236 and/or memory 234 described above, the classical system 231 can comprise one or more computer and/or machine readable, writable and/or executable components and/or instructions that, when executed by processor 236, can facilitate performance of one or more operations defined by such component(s) and/or instruction(s).

Turning now to the additional components of the classical system 231, generally, quantum circuits 250 received and/or obtained by the classical system 231 can be analyzed, such as by one or both of the mapping component 232 and scheduler component 238. Based on information from the quantum system 201, the mapping component 232 can map a quantum circuit 250 to a physical qubit layout 252 of the quantum processor 206 (e.g., of one or more qubits of the quantum logic circuit 218). The scheduler component 238, based on additional information from the quantum system 201 and on the mapping information from the mapping component 232, can schedule execution of the quantum circuits 250 in a queue. The additional information from the quantum system 201 can comprise times for running iterations of quantum circuits, times for diagnostic checks, setup, calibration and/or maintenance, and/or the like.

The measurement component 239, in response to receipt of one or more quantum measurements 240, such as from the readout component 214, can apply one or more equations to facilitate determination of one or more characteristics of the affected qubit. These characteristics can include and/or be related to frequency, excited state, probability of finding the affected qubit in a particular qubit state, and/or coherence/deterioration times of the qubit. These characteristics can be determined absent external effects that can shift the qubit's frequency, including but not limited to DC electric field and/or mechanical strain. These characteristics can also be determined absent a magnetic flux bias, and thus the qubits analyzed and/or affected can be single junction qubits and/or fixed frequency qubits.

In one or more embodiments, the measurement component 239 can be comprised at least partially by the quantum system 201 and/or be a component external to the classical system 231.

Turning now to the quantum system 201, generally based on the quantum job request 224, on physical qubit layouts 252, and/or on the associated queue of quantum circuits 250 to be executed, the quantum operation component 216 and/or quantum processor 206 can direct execution of the quantum circuits 250 at the quantum logic circuit 218.

Generally, the quantum system 201 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 240, can be responsive to the quantum job request 224 and associated input data and can be based at least in part on the input data, quantum functions and/or quantum computations.

In one or more embodiments, the quantum system 201 can comprise one or more components, such as a quantum operation component 216, a quantum processor 206, pulse component 212 (e.g., a waveform generator) and/or a readout component 214. It is noted that in other embodiments, the readout component 214 can be comprised at least partially by the classical system 231 and/or be external to the quantum system 201. The quantum processor 206 can comprise the quantum logic circuit 218 comprising one or more, such as plural, qubits 217. Individual qubits 217A, 217B and 217C, for example, can be transmon qubits, and can be fixed frequency and/or single junction qubits. In other embodiments, one or more of the individual qubits 217A, 217B and/or 217C can be multi-junction qubits.

The quantum processor 206 can be and/or comprise any suitable processor. The quantum processor 206 can generate one or more instructions for controlling the one or more processes of the quantum operation component 216 and/or for controlling the quantum logic circuit 218.

The quantum operation component 216 can obtain (e.g., download, receive, search for and/or the like) a quantum job request 224 requesting execution of one or more quantum programs 250 and/or a physical qubit layout 252 generated by the classical system 231. The quantum operation component 216 can determine one or more quantum logic circuits, such as the quantum logic circuit 218, for executing a quantum program. In one or more embodiments, the quantum operation component 216 and/or the quantum processor 206 can direct the pulse component 212 to generate one or more pulses, tones, waveforms, signals and/or the like to affect one or more of the qubits 217.

The quantum job request 224 can be provided in any suitable format, such as a text format, binary format and/or another suitable format. In one or more embodiments, the quantum job request 224 can be received by a component other than a component of the quantum system 201, such as a by a component of the classical system 231.

The pulse component 212 can perform one or more quantum processes, calculations and/or measurements for executing one or more quantum circuits on the one or more qubits 217. For example, the pulse component 212 can operate one or more qubit effectors, such as qubit oscillators, harmonic oscillators, pulse generators and/or the like, such as comprised by the pulse component 212, to cause one or more pulses to stimulate and/or manipulate the state(s) of the one or more qubits 217 comprised by the quantum system 201. That is, the pulse component 212, such as in combination with the quantum processor 206, can execute operation of a quantum circuit 250 on the plurality of qubits 217 of the quantum logic circuit 218 (e.g., qubit 217A, 217B and/or 217C). In response, the quantum operation component 216 can output one or more quantum job results, such as one or more quantum measurements 240.

The quantum logic circuit 218 and a portion or all of the pulse component 212 can be contained in a cryogenic environment, such as generated by a cryogenic chamber 225, such as a dilution refrigerator. Indeed, a signal can be generated by the pulse component 212 within the cryogenic chamber 225 to affect one or more of the plurality of qubits 217. Where the plurality of qubits 217 are superconducting qubits, cryogenic temperatures, such as about 4K or lower can be employed to facilitate function of these physical qubits. Accordingly, one or more elements of the readout component 214 also can be constructed to perform at such cryogenic temperatures.

The readout component 214, or at least a portion thereof, can be contained in the cryogenic chamber 225, such as for reading a state, frequency and/or other characteristic of qubit, unperturbed, excited, decaying or otherwise. Furthermore, as will be explained in detail below, the readout component 214 can employ one or more equations, databases and/or other data/metadata to determine one or more decay times $T_1$, probabilities $P_1$ of a qubit being in a particular state, qubit shifted frequencies in response to a pulse, and/or one or more other characteristics, states and/or energies of a qubit. The one or more equations, databases and/or other data/metadata can be stored at any suitable storage component internal and/or external to the quantum system 201.

It is noted that the processor 236 and/or another component of the classical system 231 can facilitate one or more of the operations of the quantum system 201. For example, the processor 236, via transmission of one or more signals to the quantum system 201 can cause the pulse component 212 to generate the first pulse, cause the pulse 212 component to generate the second pulse, and/or cause the readout component 214 and/or quantum operation component 216 to send out one or more qubit measurements 240. One or more of such instructions can be included in one or more scheduling and/or mapping instructions, such as provided by the respective scheduler component 238 and/or mapping component 232, provided to the quantum system 201.

Next, discussion turns to diagnostics that can be performed employing the quantum system 201. Generally, the diagnostics can allow for better understanding and/or planning of the quantum job queue, qubit decay and/or qubit coherence relative to the quantum logic circuit 218. These diagnostics can be performed at any suitable interval, such as between execution of quantum jobs and/or at a defined and uniform interval, such as every 6 hours, every 3 hours, every 1 hour and/or any other suitable interval. The diagnostic processes to be discussed can be performed on any number, one or more, of the qubits 217 of the quantum logic circuit 218 to gain a better understanding of frequency space about the qubit frequencies of these qubits 217. This frequency space(s) can affect operation of quantum circuits 250, such as by affecting qubit resonance, decay and/or coherence. Indeed, one or more two-level systems (TLSs) in the frequency space of just a single qubit frequency can fluctuate dynamically over time, and can reduce qubit coherence, such as causing failure of execution of a quantum circuit.

The following/aforementioned description(s) refer(s) to the operation of a single set of diagnostics run on a single qubit. However, employment of the diagnostics can be facilitated, where suitable at one or more qubits at a time of a quantum system. For example, non-neighbor qubits of a qubit logic circuit can be simultaneously measured.

Turning now to FIGS. 3A to 6, one or more diagnostic processes that can be executed and facilitated by the non-limiting system 200 will be described. The diagnostic processes can comprise determining qubit shifted frequencies, based on the known shifted frequencies determining probabilities $P_1$ of a qubit being at a particular state at a particular time, based on the probabilities $P_1$ determining one or more $T_1$ (energy relaxation) times of a qubit from different shifted frequencies, and/or facilitating postulation of presence of one or more TLSs and/or TLS transitions/fluctuations. That is, employing the diagnostic processes, spectral dynamics of $T_1$ times of qubits can be analyzed, such as by employing the off-resonant AT microwave tones to induce an effective frequency shift $\Delta\omega_q$.

Figure 3B:
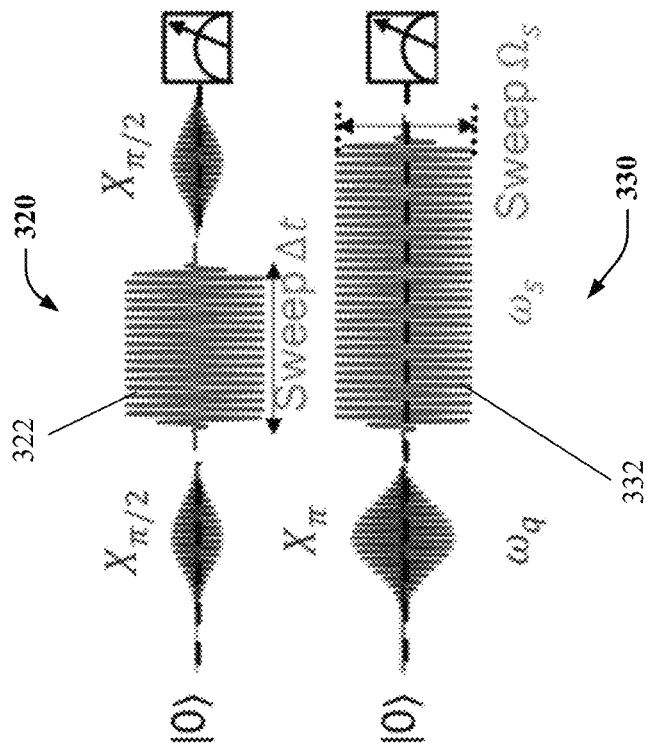
FIG. 3B illustrates a pair of pulse sequences that can be employed by the non-limiting system of FIG. 2, in accordance with one or more embodiments described herein.
Figure 3A:
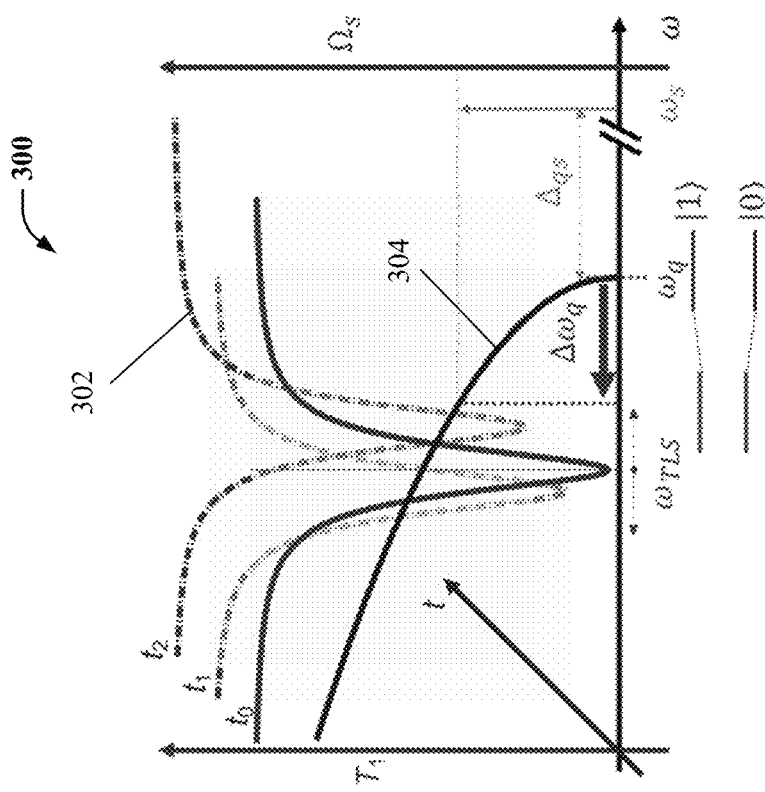
FIG. 3A illustrates a graph resulting from energy relaxation spectroscopy showing schematically how parameters affect the qubit frequency shift and the qubit $T_1$ (energy relaxation time).

Referring first to FIG. 3A, energy relaxation spectroscopy is generally illustrated. Such energy relaxation spectroscopy, employing an AT tone, can be employed to understand the frequency space of a fixed frequency qubit, absent use of, but not limited to, magnetic flux tuning, DC electric field, or mechanical strain, to rapidly determine $T_1$ relaxation times at different shifted frequencies of the qubit, without the need to separately measure (e.g., including waiting for the excited qubit to again reach ground state) at each different shifted frequency.

The frequency space of a single qubit is illustrated relative to being acted upon by an AT tone. The plots 302 of graph 300 illustrate $T_1$ relaxation times of a qubit vs. qubit frequency ($\omega_q$). The plot 304 illustrates that in the presence of an AT tone at frequency $\omega_s$ and drive amplitude (vertical) $\Omega_S$, the frequency $\omega_q$ of the qubit follows the plot 304 and changes by an amount $\Delta\omega_q$. It is noted that TLSs decrease the $T_1$ relaxation time when on resonance with the qubit frequency $\omega_q$, as shown by the dips at the plots 302. Because frequencies of TLSs ($\omega_{TLS}$) fluctuate in time, the position of a TLS (generally alluded to by dips in $T_1$) can vary over time, and thus may or may not affect qubit coherence depending on the time and/or the qubit frequency shift employed.

That is, a temporary (non-continuous) AT tone can be applied to an excited qubit with an amount of additional power/amplitude $\Omega_S$ to temporarily shift the frequency of the qubit according to how much power/amplitude $\Omega_S$ is applied. The shift is generally quadratic, in view of the AT tone. Use of the AT tone can allow for moving the qubit frequency through the frequency space about the qubit and ideally into resonance with a TLS. In this manner, frequency space about the qubit frequency can be probed using the qubit, to detect, after one or more computations using the results of measurements of the qubit, where a coherence time of the qubit may be low and/or where a TLS can be at a particular instant. Indeed, generally, a neighborhood of the unperturbed state of the qubit can be mapped.

Indeed, without the application of flux bias and inclusion and modification due to multi-junctions, the neighborhood can more easily be obtained. It is noted, however, that the diagnostic processes described herein also can function for use with multi-junction qubits.

It also is noted that a described diagnostic process can be employed in an embodiment where a continuous AT tone is applied to a qubit. That is, the qubit would be continuously shifted, not just temporarily. In such case, the qubit and/or quantum circuit can be recalibrated in that typical quantum circuits are generally based on non-constantly shifted qubits.

Turning next to FIG. 3B, a pair of pulse sequences are illustrated at 320 and 330 that can be applied to a qubit 217, such as by the pulse component 212, such as via control by the processor 206 and/or quantum operation component 216.

The pulse sequence 320 represents an altered Ramsey experiment/sequence, in that the Ramsey experiment/sequence employs an AT tone 322. The pulse sequence 320 comprises a first pulse X, such as a $\pi/2$ pulse, that can be applied to the particular qubit. This first pulse X can put the qubit on its equator. After emission of the first pulse X, an AT tone 322 can be applied, also by the pulse component 212, to the qubit to thereby shift the resonating frequency of the qubit. The AT tone 322 can be applied with fixed power $\Omega_S$ and sweeping of $\Delta t$ (e.g., for different $\Delta t$, also referred to herein as delay times). Generally, thereafter cessation of the second pulse (e.g., the AT tone 322), a measurement can be taken, such as by the readout component 214 of the qubit. That is, a third pulse X can be applied to the qubit, such as another $\pi/2$ pulse, after the cessation of the second pulse. The readout component 214, such as via a measurement pulse, waveform and/or other signal applied to the qubit by the pulse component 212, can take a measurement and thereafter determine the shift of the qubit frequency. The Ramsey fringe can be fit to a sine function. The change in frequency (from no AT tone applied) can indicate a change due to the AT tone applied. For example, the fit of the resulting Ramsey fringes can correspond to the frequency shift(s). These resulting frequency shifts can be employed in subsequent diagnostics, to be described relative to additional figures herein, as known shifts cause by a particular AT tone(s) 322.

Figure 4:
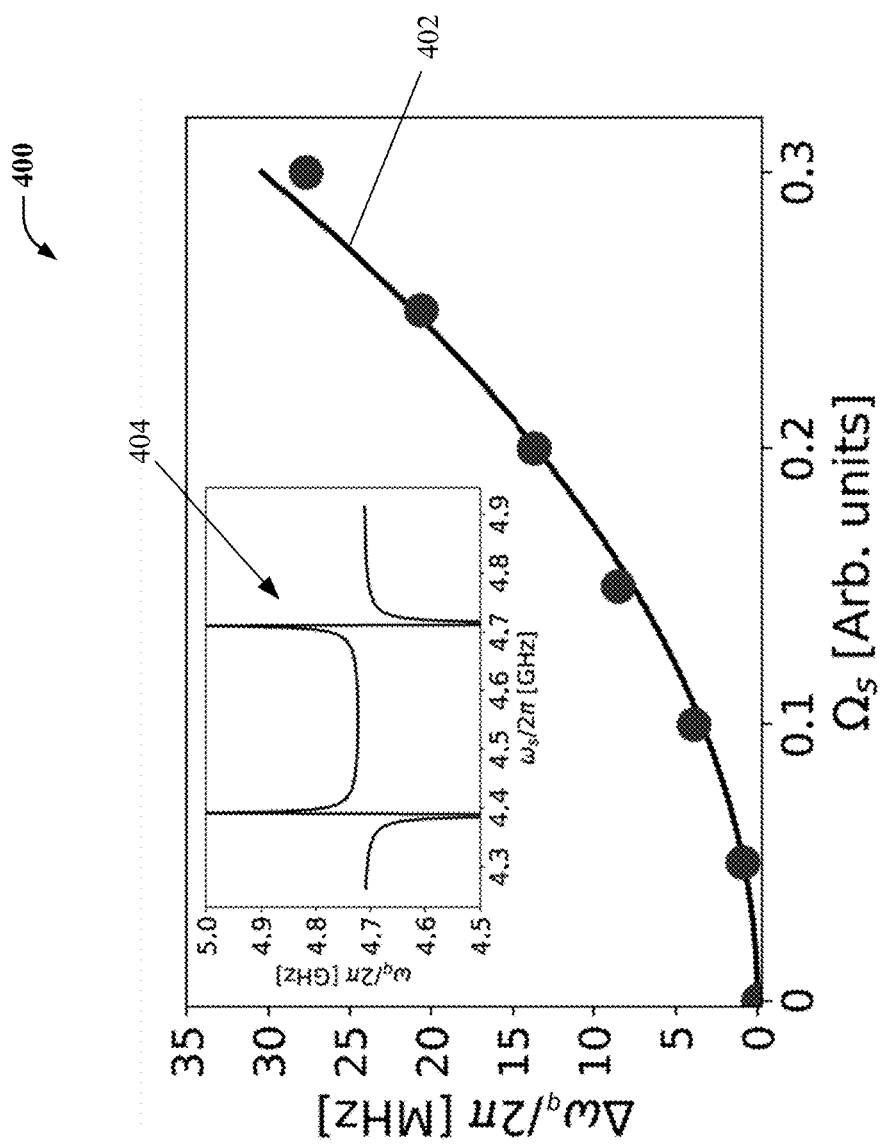
FIG. 4 illustrates a graph of shifted qubit frequencies, in accordance with one or more embodiments described herein. The inset illustrates an example of qubit frequency dependence on Autler-Townes tone for fixed amplitude of the tone.

For example, turning briefly to FIG. 4, the plot 402 of the graph 400 illustrates the exponential curve of shifted qubit frequency $\omega_q/2\pi$ in gigahertz (GHz), graphed against the different $\Omega_S$ values of the AT tone 322 employed on the qubit. In one case, using Equation 1, the $\Delta\omega_q$ shift in qubit frequency from unperturbed frequency can be determined, such as via the measurement component 239. In particular, and for exemplary purposes only, the plot 402 illustrates shifts of the f01 of the qubit, obtained via Equation 1. The shifts have a quadratic dependence on the drive amplitude $\Omega_S$.

$$\Delta\omega_q = \frac{\delta_q \Omega_s^2}{2\Delta_{qs}(\delta_q + \Delta_{qs})},$$ Equation 1 where $\Delta_{qs}$ is the detuning ($=\omega_q-\omega_s$), and $\delta_q$ is the anharmonicity of the qubit given by f12-f01.

This Equation 1 represents a Duffling oscillator model, which can analytically describe the AT shift cause to the qubit in response to the temporarily applied AT tone. Magnitude and sign of the AT shift can be manipulated by the detuning and the drive amplitude of the AT tone. Large frequency shifts can be obtained by driving close to the transmon transitions, but this can lead to undesired excitations/leakage out of the respective two-state manifold. Instead, in one example, AT shifts, such as of 10's of megahertz (MHz) with modest drive amplitudes and a fixed detuning $\Delta_{qs}$ of +/− about 50 MHz can be employed.

The inset plot 404 illustrates the frequency of the qubit $\omega_q$ as a function of the frequency of the AT tone $\omega_s$ at a fixed drive amplitude $\Omega_S$, for a qubit with f01 (excitation frequency from |0> to the |1> state) at about 4.7 GHz show in the y-axis, where $\omega_s$ is the frequency of the AT tone applied. As shown, the frequency of the qubit $\omega_q$ changes rapidly for $\omega_S$ near the poles at f01 at about 4.7 GHz and f12 (excitation frequency from |1> to |>2 state) at about 4.4 GHz.

Additionally, four scenarios can be predicted along the $\Omega_S$ x-axis. First, for $\omega_s$ below f12, the f01 frequency can shift down. Second for $\omega_s$ above f12, the f01 frequency can shift up. Third, for $\omega_s$ below f01, the f01 frequency can shift up. Finally, for $\omega_s$ above f01, the f01 frequency can shift down.

Turning back to FIG. 3B, the pulse sequence 330 represents pulses employed for $T_1$ relaxation spectroscopy with an AT tone. As shown, a first pulse at $\pi$ can be emitted by the pulse component 212 to the qubit. This first pulse can excite the qubit to a first state |1>. A second pulse 332, being an AT tone at a fixed frequency $\omega_S$ can be temporarily emitted by the pulse component 212, to the qubit. This AT tone can be swept over varying power/amplitudes $\Omega_S$, to result in decay at a different qubit frequency (e.g., shifted qubit frequency) $\omega_q$ of the qubit. That is, by applying the AT tone to the excited qubit, the qubit's frequency can be shifted. A sweep of $\Omega_S$ can thus correspond to measurements of decay at different qubit frequencies. The resultant measurement information of the qubit at the different qubit frequencies, such as attained and measured by the readout component 214, can be employed to determine probabilities $P_1$ of the qubit to be at a particular state, such as the |1> state, at a particular time while at a single time interval, and further to determine a plurality of $T_1$ times at the different shifted frequencies, such as by the measurement component 239. This can be completed absent actually evaluating the qubit at each of those shifted frequencies for the full relaxation time in order to thus attain the relaxation times $T_1$. Indeed, the sequence 330 at FIG. 3B, and/or a sequence similar thereto, can be run repeatedly, such as in uniform and/or non-uniform increments. Over a period of time, where the sequence 330 has been additionally run for the same particular qubit, predictions can be calculated.

Figure 5:
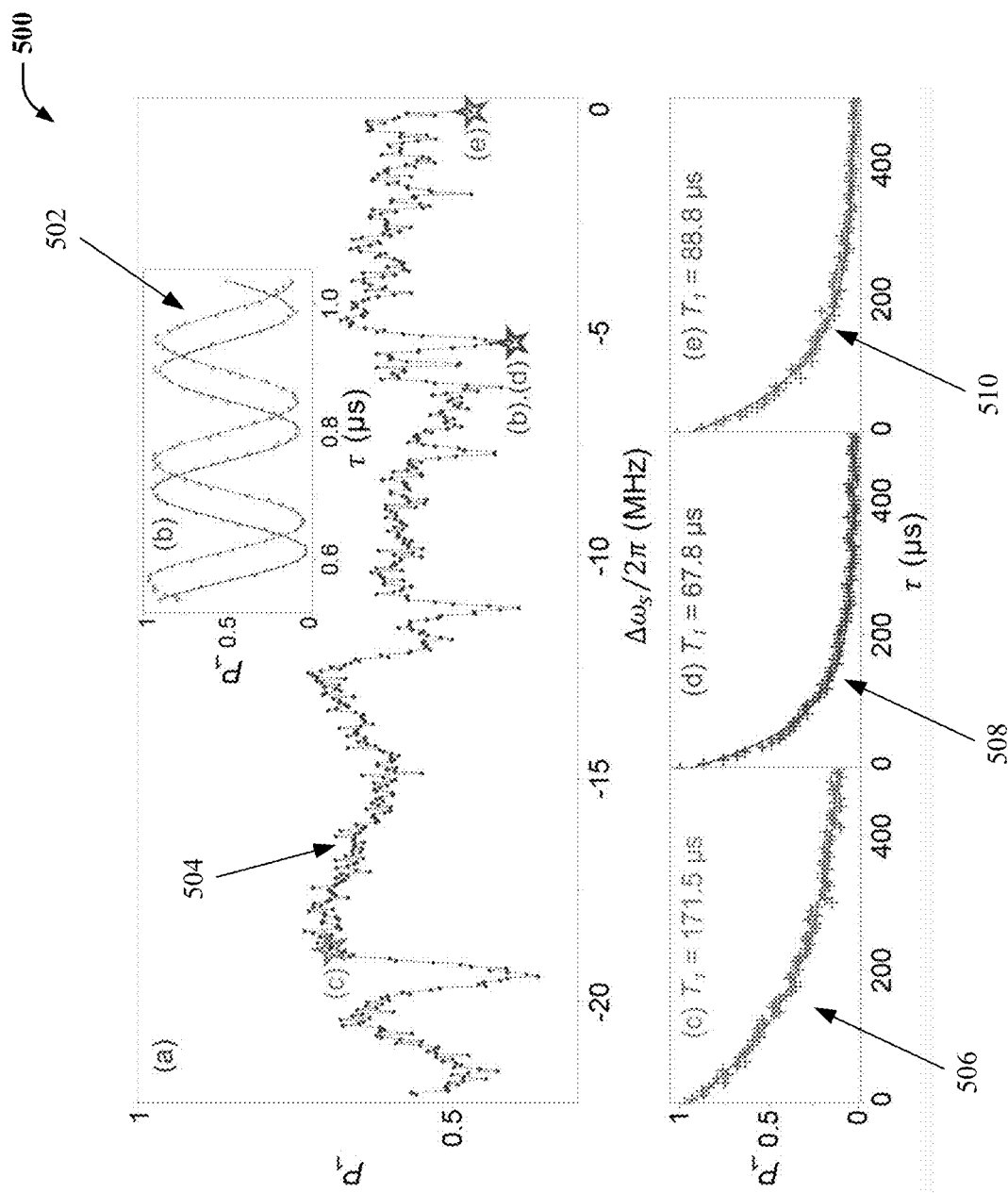
FIG. 5 illustrates a set of graphs demonstrating outcomes of employment of energy relaxation spectroscopy by the non-limiting system of FIG. 2, in accordance with one or more embodiments described herein. The inset illustrates a measurement used to identify the shift in qubit frequency using the non-limiting system of FIG. 2 and pulses from FIG. 3B.

Turning now to FIG. 5, explanation follows regarding how a single point on the curve of exponential decay of a qubit state, such as of the |1> state, being a $P_1$ value, can be employed as a proxy for $T_1$ at varying shifted qubit frequencies $\omega_q$. As used herein, $P_1$ can represent the probability of finding the qubit in the |1>, or another state, at a particular qubit frequency $\omega_q$ at a given time interval. This probability $P_1$ can be employed to determine the probability of how high the coherence is for that qubit.

For example, exponential decay of the |1> state can be assumed, with a delay time (e.g., about 50 μs) can be employed after the |1> state is populated, and $T_1$ can be equal to $-t/\ln(P_1)$. That is, there is a $P_1$ for every shifted qubit frequency and every time point at which $P_1$ is measured. $P_1$ can be a function, such as $P_1$ ($\Delta\omega_r$). A $T_1$ for each shifted frequency can be estimated from each $P_1$, such as employing Equation 2.

$$T_1(\Delta\omega) = -\tau/\ln(P_1(\Delta\omega)), \quad \text{Equation 2:}$$

where $\Delta\omega$ is the frequency shift and $\tau$ is the fixed time delay.

That is, instead of measuring the entire $T_1$ decay at any particular shifted qubit frequency, the excited state probability $P_1$ is employed, after a fixed delay time as a measure of $T_1$. This method can speed up spectral scans as compared to the existing techniques (measuring the entire $T_1$ decay at any particular shifted qubit frequency).

Further, the spectral scans (e.g., diagnostic processes) can be repeated, such as at a repetition rate of about 1 kHz. One or more reset techniques known to one having ordinary skill in the art can be employed to further speed up the repetition rate, thus allowing for probing faster TLS dynamics. In one embodiment, an amplitude sweep with off-resonant pulses at fixed detuning (e.g., about +/−50 MHZ) and duration (delay time of about 50 μs) can be employed as the second pulse, after exciting the qubit with one or more first pulses (which can be the same or different from one another). See, e.g., pulse sequence 330 at FIG. 3B. Such pulsed AT sequence 330 can enable faster spectroscopy by circumventing re-calibration of the π and π/2 pulses at each frequency. The amplitude points in the sweep can be related to particular AT shifts by use of a Ramsey sequence (e.g., pulse sequence 320 of FIG. 3B) performed before or after the aforementioned spectral scans. Based on these diagnostic processes, $P_1$ values can be attained.

That is, at graph 500, plot 504, plotted are $P_1$ values against change in AT tone frequency $\Delta\omega_s/2\pi$ in megahertz (MHz). Plot 504 is for a single delay time of about 50 μs. Measurements are taken at different frequencies of the qubit to get each $P_1$ value on the plot 504. For example, illustrated is probability $P_1$ of qubit measurement resulting in |1> state (such as over 1000 averages) for an AT tone detuned 50 MHz above the qubit f01, using the pulse sequence 330 of FIG. 3B. To speed up measurements, $P_1$ can be used as a proxy for $T_1$ at a fixed delay time of 50 us. Generally, delay time can be selected to have high contrast between $P_1$ of about 1 (e.g., delay time of about 0) and $P_1$ of about 0 (e.g., delay time>>$T_1$). For example, a delay time of about 0.5 $T_1$ can provide a reasonable contrast. The X values can be calibrated from $\Omega_S$ drive amplitude to $\omega_q$ qubit frequency using the Ramsey experiment pulse sequence 320 of FIG. 3B (e.g., using a Ramsey fringe measurement of qubit frequency as known to one having ordinary skill in the art). Additional X values can be scaled by the quadratic expression of Equation 1. Put another way, in the X-axis are shifted frequencies of the qubit, measured from a Ramsey experiment, calibrated using the qubit frequency shift value for every desired value of power of $\Omega_S$.

As illustrated, the plot 504 comprises a plurality of peaks and valleys. A dip can be representative of a likely TLS.

Furthermore, relative to single points of $P_1$ on the plot 504, a $T_1$ experiment can be executed, by fixing the frequency shift instead of power, and varying the amount of power, and can map a full decay curve for each of those points, as shown at plots 506, 508 and 510. The $T_1$ experiment can comprise measuring $P_1$ for different delay times. This can produce an exponential decay. For example, plots 506, 508, 510 illustrate $T_1$ decay curves from which a $T_1$ can be extracted (rather than estimating from a single $P_1$ at a single delay time).

Accordingly, by being able to shift the frequency of the qubit while observing the relaxation at the new shifted frequencies, by employing the pulse sequence 330, one can determine where qubit coherence will be worse (dips at plot 504) or better, and without direct observance of decay at each of the shifted qubit frequencies.

In one or more embodiments, $P_1$ can be spectrally resolved to about +/−about 2 MHz to about 25 MHz around the individual qubit frequencies. The narrow frequency range combined with measuring non-neighbor sets of qubits simultaneously can avoid strong $P_1$ suppression from resonances with neighboring qubits, with the coupling bus, or with common low-Q parasitic microwave modes.

Turning additionally to the plot 502 at FIG. 5, illustrated are results of the Ramsey Experiment pulse sequence 320. Generally, to achieve the results of FIG. 4, frequency can be extracted from the plot 502 results, which can translate to how the actual measurements at FIG. 4 are achieved. Generally, the two curves of plot 502 can be simultaneously fit to a sine curve to give a difference between frequency of the qubit and frequency of the shift.

Figures 6A, 6B:
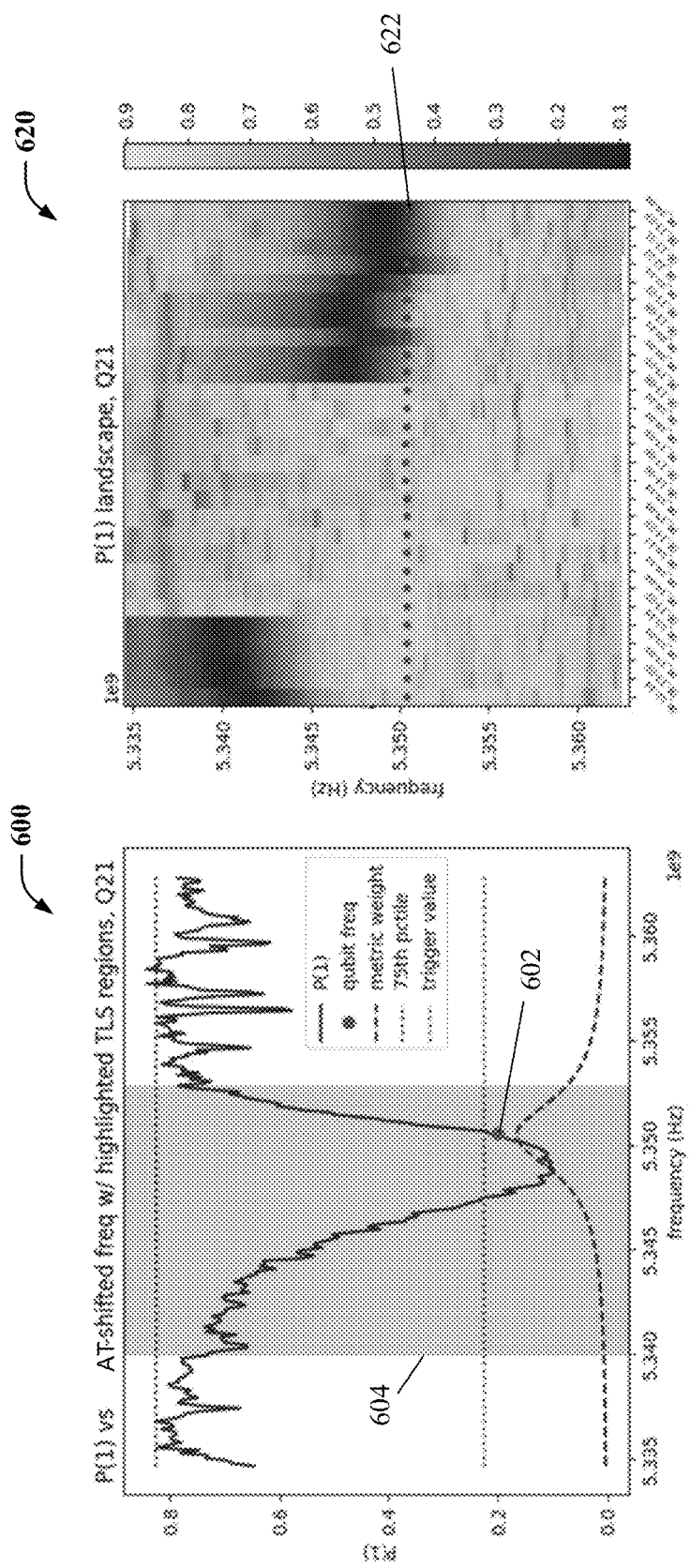
FIG. 6A illustrates a graph of $P_1$ probability of a single qubit over a range of applied Autler-Townes tones of varying frequency, fixed time and fixed power/amplitude, in accordance with one or more embodiments described herein.
FIG. 6B illustrates a plot of a $P_1$ probability landscape of a single qubit, the plot comprising a range of applied Autler-Townes tones of varying frequency and fixed power/amplitude graphed against time, in accordance with one or more embodiments described herein.

Referring now to FIGS. 6A and 6B, illustrated are additional plots of understandings that can be gained via the aforementioned processes explained via FIGS. 3A-5.

At FIG. 6A, plot 600 illustrates a sweep of $P_1$ vs. calibrated qubit frequency ($\omega_s$) using detuning of about +80 MHz for negative shift and about −80 MHZ for positive shift near the qubit f01 near about 5.35 GHz (e.g., at dot 602). A broad dip spanning roughly from about 5.34 GHz to 5.353 GHz (shaded area 604) is postulated as representative of a strong TLS.

Turning next to FIG. 6B, a representative plot 620 illustrates repeat line traces of plot 504 of FIG. 5, via repeated spectral scan, approximately once every 3-4 hours, extended over hundreds of hours for a particular qubit. That is y-axis illustrates frequency space relative to one qubit, and the x-axis represents time, with increments of about 6 days being marked. Even though this is a large quantity of data, the scans are comparatively shorter than as employed in existing techniques requiring measuring the entire $T_1$ decay at each desired shifted qubit frequency. $P_1$ is shown as a shaded color scale. A broad TLS (dark shade) can be found near about 5.34 GHz, then disappears for roughly 5 days, then returns near resonance with the qubit (dots 622 represent f01). This situation can result in inability to utilize the respective qubit while the situation persists, otherwise possibly resulting in failure of execution of a quantum circuit employing the particular respective qubit. That is, the illustrated detection can allow for assessment the root cause and adjust queue closures for customers employing a qubit device.

Figure 7:
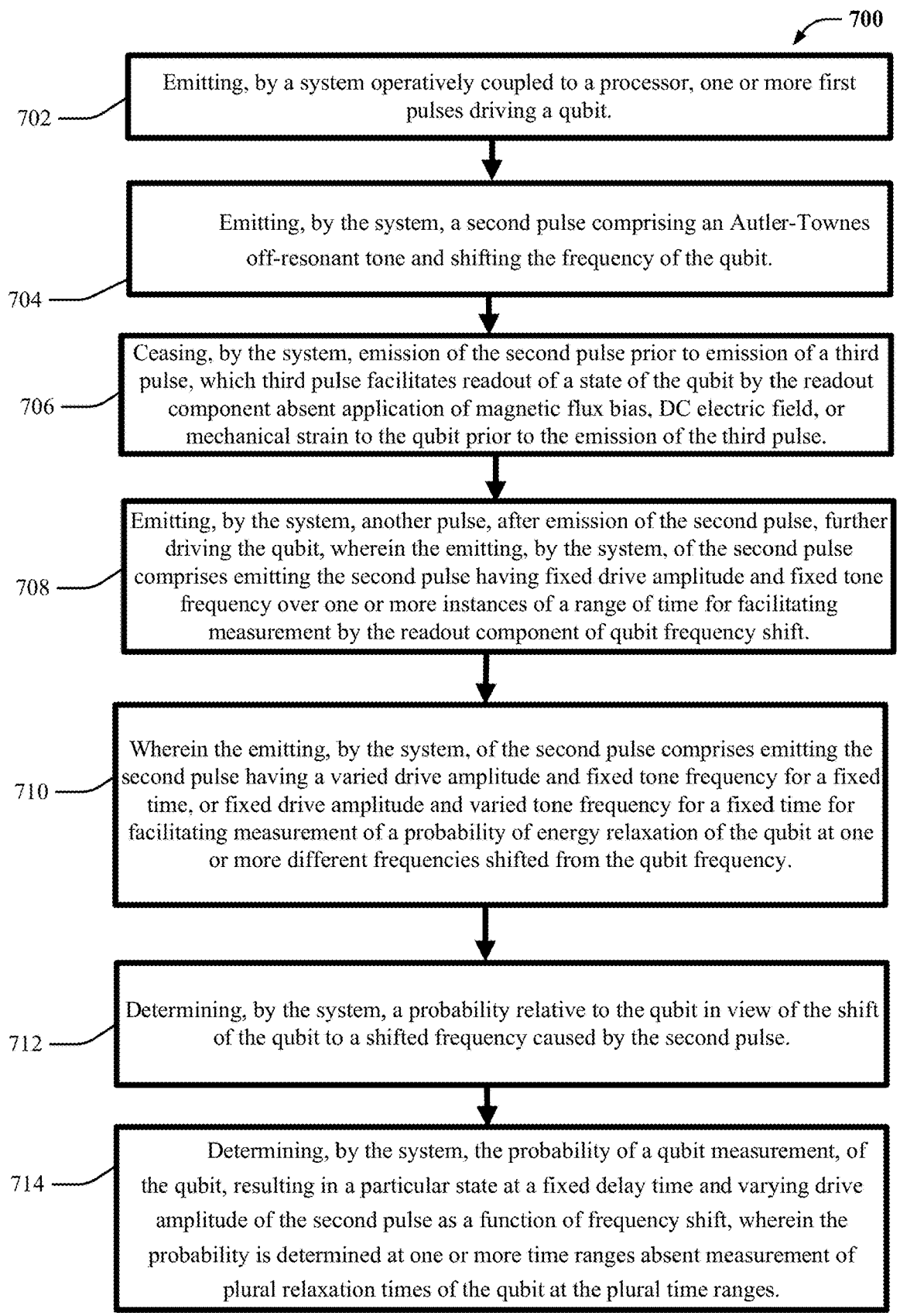
FIG. 7 illustrates a process flow for facilitating analysis of coherence parameters of a single qubit, in accordance with one or more embodiments described herein.

Next, FIG. 7 illustrates a flow diagram of an example, non-limiting method 700 that can facilitate analysis of qubit coherence parameters of a quantum system, in accordance with one or more embodiments described herein, such as the non-limiting system 200 of FIG. 2. While the non-limiting method 700 is described relative to the non-limiting system 200 of FIG. 2, the non-limiting method 700 can be applicable also to other systems described herein, such as the non-limiting system 100 of FIG. 1. Repetitive description of like elements and/or processes employed in respective embodiments is omitted for sake of brevity.

At 702, the non-limiting method 700 can comprise emitting, by a system (e.g., pulse component 212) operatively coupled to a processor, one or more first pulses driving a qubit. In one or more example, the first one or more pulses can drive the qubit to an excited state of order 1 or higher.

At 704, the non-limiting method 700 can comprise emitting, by the system (e.g., pulse component 212), a second pulse comprising an Autler-Townes off-resonant tone and shifting the frequency of the qubit.

At 706, the non-limiting method 700 can comprise ceasing, by the system (e.g., pulse component 212), emission of the second pulse prior to emission of a third pulse, which third pulse can facilitate readout of a state of the qubit by the readout component absent application of external effects that may shift the qubit frequency prior to emission of the third pulse, including but not limited to magnetic flux bias, DC electric field, or mechanical strain. At 708, the non-limiting method 700 can comprise emitting, by the system (e.g., pulse component 212), another pulse, after emission of the second pulse, further driving the qubit, wherein the emitting, by the system (e.g., pulse component), of the second pulse comprises emitting the second pulse having fixed drive amplitude and fixed tone frequency over one or more instances of a range of time for facilitating measurement by the readout component of qubit frequency shift. For example, this step can be part of a Ramsey sequence (e.g., pulse sequence 320).

At 710, the non-limiting method 700 can comprise wherein the emitting, by the system (e.g., pulse component), of the second pulse comprises emitting the second pulse having a varied drive amplitude and fixed tone frequency for a fixed time, or fixed drive amplitude and varied tone frequency for a fixed time for facilitating measurement of a probability of energy relaxation of the qubit at one or more different frequencies shifted from the qubit frequency. For example, this step can be part of an energy relaxation probing pulse sequence (e.g., pulse sequence 330).

At 712, the non-limiting method 700 can comprise determining, by the system (e.g., measurement component 239), a probability relative to the qubit in view of the shift of the qubit to a shifted frequency caused by the second pulse.

At 714, the non-limiting method 700 can comprise determining, by the system (e.g., measurement component 239), the probability of a qubit measurement, of the qubit, resulting in a particular state at a fixed delay time and varying drive amplitude of the second pulse as a function of frequency shift, wherein the probability is determined at one or more time ranges absent measurement of plural relaxation times of the qubit at the plural time ranges. That is, $T_1$ decay is not entirely measured at various shifted frequencies.

In one or more embodiments, the probability can be of the qubit being found in another excited state, other than the excited state to which the qubit was initially driven prior to application of the second pulse, after a specified time after cessation of the second pulse.

For simplicity of explanation, the computer-implemented and non-computer-implemented methodologies provided herein are depicted and/or described as a series of acts. It is to be understood that the subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

In summary, one or more systems, devices, computer program products and/or computer-implemented methods of use provided herein relate to analysis of qubit coherence parameters of a physical qubit layout of a quantum computer. A system can comprise a pulse component for transmitting signals to a qubit, a readout component for receiving signals form the qubit, a memory that stores computer executable component, and a processor that executes the computer executable components stored in the memory. The computer executable components are executable to cause the pulse component to generate a first pulse to drive the qubit, cause the pulse component to generate a second pulse comprising an Autler-Townes off-resonant tone, and determine a probability relative to the qubit, in view of a shift of the qubit to a shifted frequency caused by the second pulse.

Generally, the one or more systems, devices, computer program products and/or computer-implemented methods of use provided herein can employ a qubit shifted in frequency by an Autler-Townes off-resonant tone (AT tone) to probe a frequency space about excitation frequencies of the qubit. Results of the probing can be employed to determine probabilities of the qubit being at one or more excited states at various times and/or at various shifted frequencies of the qubit. Understanding of variance in the probabilities can allow for a better understanding of TLS in the vicinity of the qubit frequency. Understanding of the probabilities $P_1$ can allow for determination of $T_1$ times of the qubit at various shifted frequencies, absent actual measurement of the plurality of $T_1$'s performed at each of the various shifted frequencies. These one or more systems, device, computer program products and/or computer-implemented methods of use can be employed relative to plural qubits of a qubit device, and they can be employed absent external effects that may shift the qubit frequency, including but not limited to magnetic flux bias (flux tuning of the qubits), DC electric field, or mechanical strain, to determine the aforementioned information and results.

Accordingly, an advantage of the aforementioned system, computer-implemented method and/or computer program product can be an increase in understanding of qubit coherence parameters and of fluctuations in the qubit coherence parameters. Further advantages can comprise an ability to rapidly plot energy relaxation of qubits and/or to collect information facilitating understanding of two-level systems (TLSs) of a particular quantum processor or quantum logic circuit.

One or more embodiments described herein can be inherently and/or inextricably tied to computer technology and cannot be implemented outside of a computing environment. For example, one or more processes performed by one or more embodiments described herein can more efficiently, and even more feasibly, provide program and/or program instruction execution, such as relative to determination of coherence parameters of a qubit of a physical qubit layout. Systems, computer-implemented methods and/or computer program products facilitating performance of these processes are of great utility in the field of quantum computing and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively probe frequency space of a qubit as the one or more embodiments described herein can facilitate this process. And, neither can the human mind nor a human with pen and paper probe frequency space of a qubit, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing one or more of the one or more operations, such as quantum and/or non-quantum operations, described and/or not specifically described herein.

Figure 8:
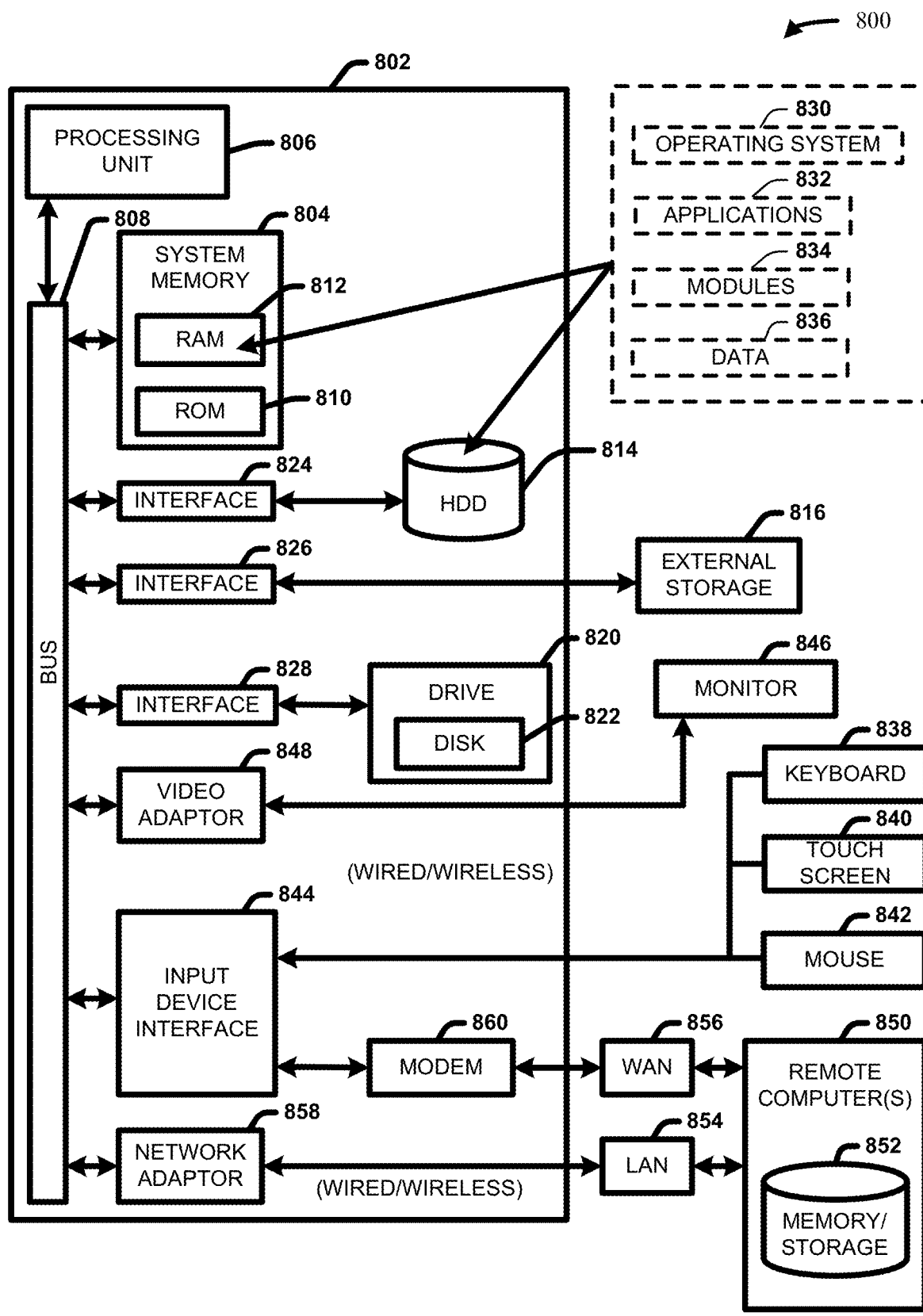
FIG. 8 illustrates a block diagram of an example, non-limiting, operating environment in which one or more embodiments described herein can be facilitated.
Figure 9:
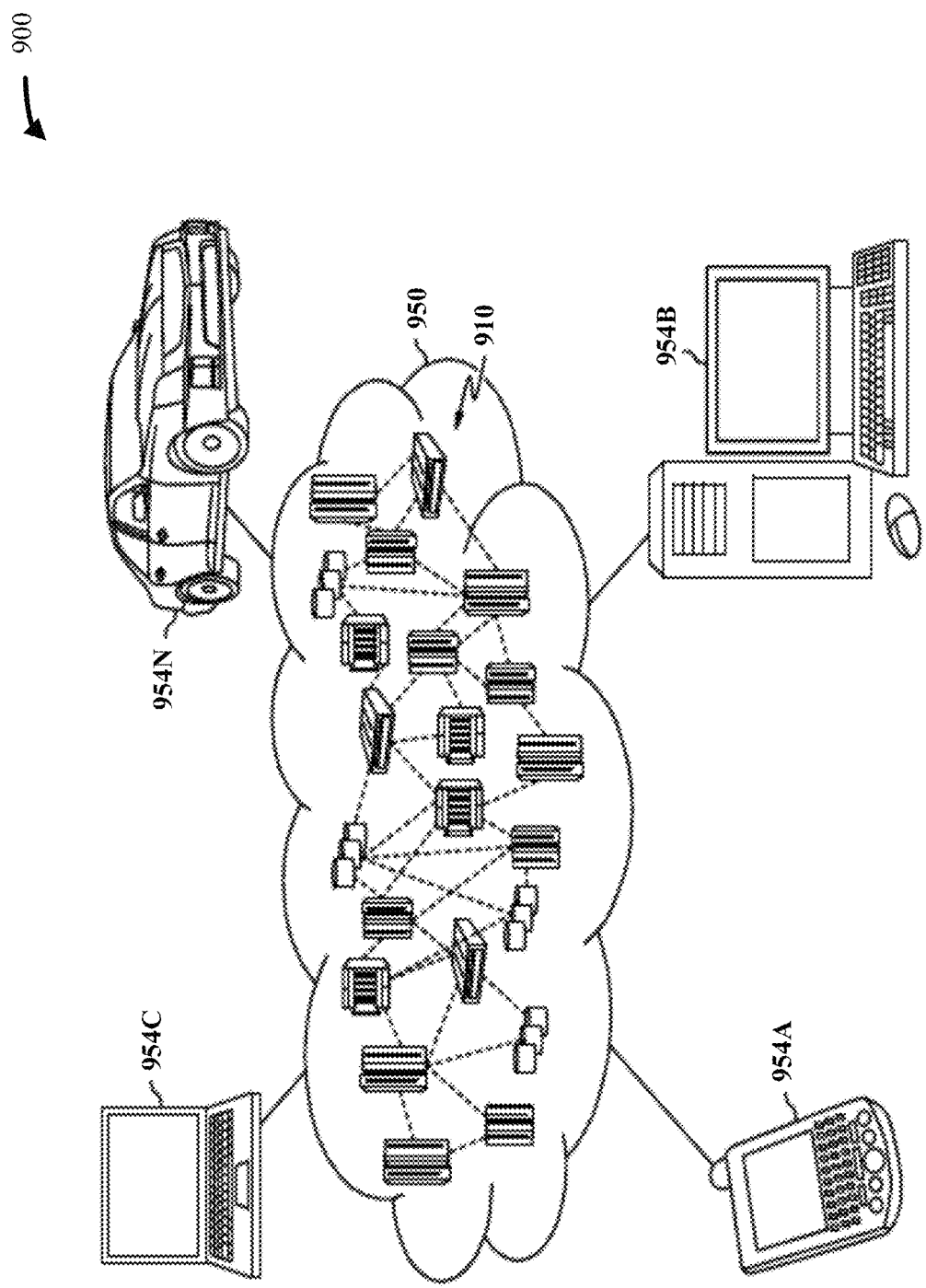
FIG. 9 illustrates a block diagram of an example, non-limiting, cloud computing environment in accordance with one or more embodiments described herein.
Figure 10:
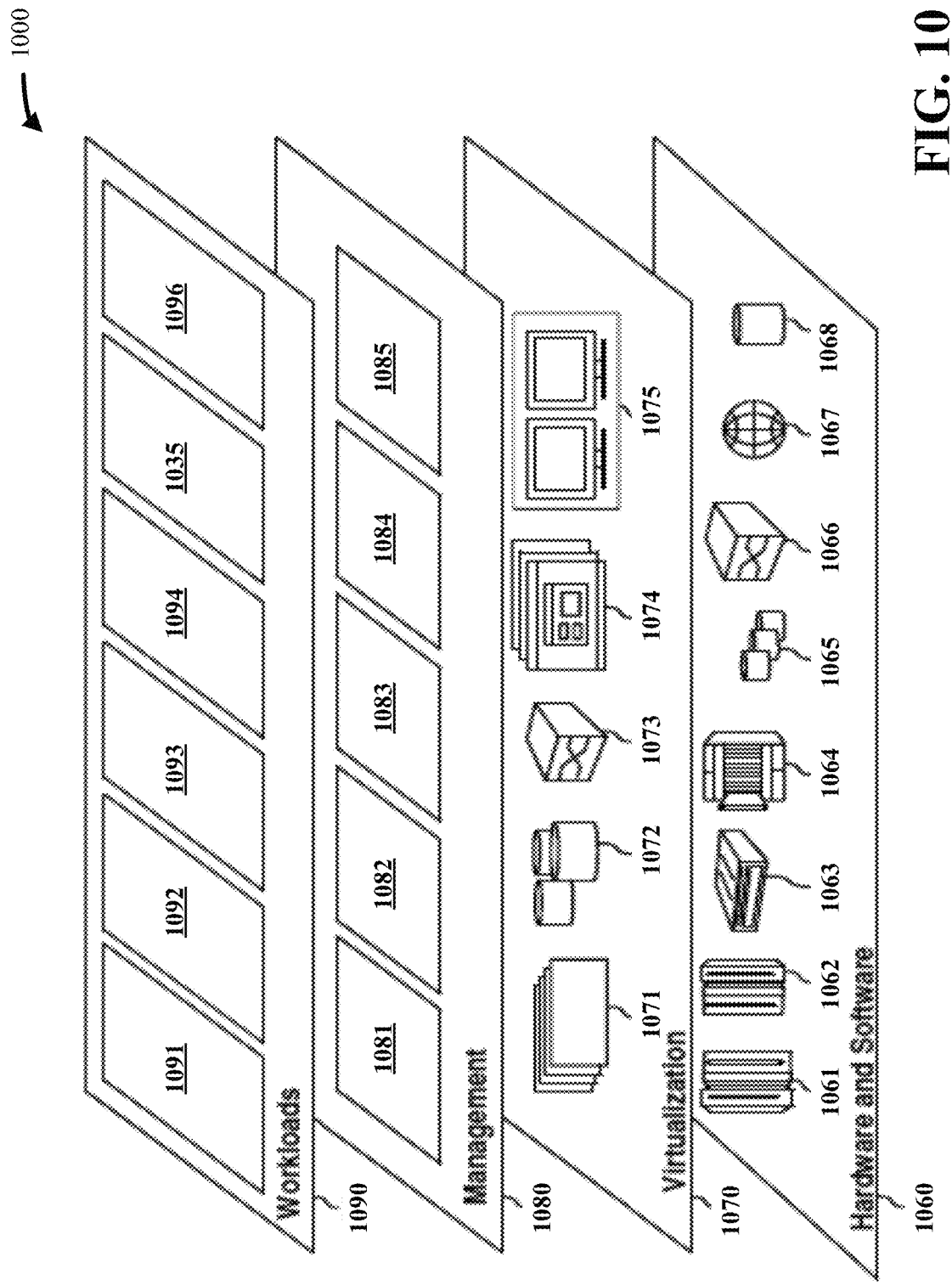
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other aspects of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the aforedescribed methods can be practiced with other computer system configurations, including single-processor or multiprocessor computer systems, mini-computers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference still to FIG. 8, the example operating environment 800 for implementing one or more embodiments of the aspects described herein can include a computer 802, the computer 802 including a processing unit 806, a system memory 804 and/or a system bus 808. One or more aspects of the processing unit 806 can be applied to processors such as 106, 206 and/or 236 of the non-limiting systems 100 and/or 200. The processing unit 806 can be implemented in combination with and/or alternatively to processors such as 106, 206 and/or 236.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100 and/or non-limiting system 200, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting systems 100 and/or 200 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting systems 100 and/or 200 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 19). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A system, comprising:
a pulse component for transmitting signals to a qubit;
a readout component for receiving signals from the qubit;
a memory that stores computer executable components; and
a processor that executes the computer executable components stored in the memory, wherein the computer executable components are executable to:
cause the pulse component to generate a first pulse to drive the qubit;
cause the pulse component to generate a second pulse comprising an Autler-Townes off-resonant tone; and
determine a probability relative to the qubit, in view of a shift of the qubit to a shifted frequency caused by the second pulse.

2. The system of claim 1, wherein the pulse component further ceases emission of the second pulse prior to emission of a third pulse, which third pulse facilitates readout of a state of the qubit by the readout component.

3. The system of claim 1, wherein the pulse component further emits another pulse, after emission of the second pulse, further driving the qubit, and wherein the pulse component emits the second pulse having fixed drive amplitude and fixed tone frequency over one or more instances of a range of time for facilitating measurement by the readout component of qubit frequency shift.

4. The system of claim 1, wherein the pulse component emits the second pulse having a varied drive amplitude and fixed tone frequency for a fixed time, or fixed drive amplitude and varied tone frequency for a fixed time, for facilitating measurement of a probability of energy relaxation of the qubit at one or more different frequencies shifted from the qubit frequency.

5. The system of claim 4, wherein the computer executable components comprise:
a measurement component that determines the probability of a qubit measurement, of the qubit, resulting in a particular state at a fixed delay time and varying drive amplitude of the second pulse as a function of frequency shift.

6. The system of claim 1, wherein the probability is determined at various time ranges absent measurement of plural relaxation times of the qubit at the plural time ranges.

7. The system of claim 1, wherein the probability is of the qubit being found in another excited state, other than the excited state to which the qubit was initially driven to prior to application of the second pulse, after a specified time after cessation of the second pulse.

8. The system of claim 1, wherein the probability at a shifted frequency is obtained absent application of magnetic flux bias, DC electric field, or mechanical strain to the qubit.

9. The system of claim 1, wherein the first one or more pulses drive the qubit to an excited state of order 1 or higher.

10. A computer-implemented method, comprising:
emitting, by a system operatively coupled to a processor, one or more first pulses driving a qubit;
emitting, by the system, a second pulse comprising an Autler-Townes off-resonant tone and shifting the frequency of the qubit; and
determining, by the system, a probability relative to the qubit in view of the shift of the qubit to a shifted frequency caused by the second pulse.

11. The computer-implemented method of claim 10, further comprising:
ceasing, by the system, emission of the second pulse prior to emission of a third pulse, which third pulse facilitates readout of a state of the qubit by the readout component absent application of magnetic flux bias, DC electric field, or mechanical strain to the qubit prior to the emission of the third pulse.

12. The computer-implemented method of claim 10, further comprising:
emitting, by the system, another pulse, after emission of the second pulse, further driving the qubit; and
wherein the emitting, by the system, of the second pulse comprises emitting the second pulse having fixed drive amplitude and fixed tone frequency over one or more instances of a range of time for facilitating measurement by the readout component of qubit frequency shift.

13. The computer-implemented method of claim 10,
wherein the emitting, by the system, of the second pulse comprises emitting the second pulse having a varied drive amplitude and fixed tone frequency for a fixed time, or fixed drive amplitude and varied tone frequency for a fixed time, for facilitating measurement of a probability of energy relaxation of the qubit at one or more different frequencies shifted from the qubit frequency.

14. The computer-implemented method of claim 10, further comprising:
determining, by the system, the probability of a qubit measurement, of the qubit, resulting in a particular state at a fixed delay time and varying drive amplitude of the second pulse as a function of frequency shift, wherein the probability is determined at one or more time ranges absent measurement of plural relaxation times of the qubit at the plural time ranges.

15. The computer-implemented method of claim 10, wherein the probability is of the qubit being found in another excited state, other than the excited state to which the qubit was initially driven prior to application of the second pulse, after a specified time after cessation of the second pulse.

16. A computer program product facilitating a process to determine a probability relative to a qubit having been excited, the computer program product comprising a computer readable storage medium having program instructions embodied therewith, the program instructions executable by a processor to cause the processor to:
cause emission, by the processor, of one or more first pulses driving a qubit;
cause emission, by the processor, of a second pulse comprising an Autler-Townes off-resonant tone and shifting the frequency of the qubit; and
determine, by the processor, a probability relative to the qubit in view of the shift of the qubit to a shifted frequency caused by the second pulse.

17. The computer program product of claim 16, wherein the program instructions are further executable by the processor to cause the processor to:
cause emission, by the processor, of another first pulse, after emission of the second pulse, further driving the qubit; and
cause the emission, by the processor, of the second pulse having fixed drive amplitude and fixed tone frequency over one or more instances of a range of time for facilitating measurement by the readout component of qubit frequency shift.

18. The computer program product of claim 16, wherein the program instructions are further executable by the processor to cause the processor to:
cause the emission, by the processor, of the second pulse having a varied drive amplitude and fixed tone frequency for a fixed time, or fixed drive amplitude and varied tone frequency for a fixed time, for facilitating measurement of a probability of energy relaxation of the qubit at one or more different frequencies shifted from the qubit frequency.

19. The computer program product of claim 16, wherein the program instructions are further executable by the processor to cause the processor to:

determine, by the processor, the probability of a qubit measurement of the qubit resulting in a particular state at a fixed delay time and varying drive amplitude of the second pulse as a function of frequency shift, wherein the probability is determined at one or more time ranges absent measurement of plural relaxation times of the qubit at the plural time ranges.

20. The computer program product of claim 16, wherein the probability is of the qubit being found in another excited state, other than the excited state to which the qubit was initially driven prior to application of the second pulse, after a specified time after cessation of the second pulse.

* * * * *